United States Patent [19]

Watanabe

[11] Patent Number: 4,981,436
[45] Date of Patent: Jan. 1, 1991

[54] VERTICAL TYPE HEAT-TREATMENT APPARATUS

[75] Inventor: Shingo Watanabe, Aikawa, Japan

[73] Assignee: Tel Sagami Limited, Kanagawa, Japan

[21] Appl. No.: 370,763

[22] Filed: Jun. 23, 1989

[30] Foreign Application Priority Data

Aug. 8, 1988 [JP] Japan .................................. 63-198293

[51] Int. Cl.$^5$ ............................................... F27D 3/12
[52] U.S. Cl. ......................................... 432/241; 432/6; 432/153
[58] Field of Search ...................... 414/217, 939; 98/36, 98/42.16, 115.3; 432/5, 6, 11, 75, 153, 239, 241, 253

[56] References Cited

U.S. PATENT DOCUMENTS

| | | | |
|---|---|---|---|
| 4,610,628 | 9/1986 | Mizushina | 432/6 X |
| 4,649,830 | 3/1987 | Tanaka | 414/217 X |
| 4,699,640 | 10/1987 | Suzuki et al. | 98/36 X |
| 4,738,618 | 4/1988 | Massey et al. | 432/241 |
| 4,923,352 | 5/1990 | Tamura et al. | 414/225 |

OTHER PUBLICATIONS

U.S. Pat. application, Ser. No. #07/249,780, Watanabe, claims 11, 15 and 16.

*Primary Examiner*—Henry A. Bennet
*Assistant Examiner*—Christopher B. Kilner
*Attorney, Agent, or Firm*—Oblon, Spivak, McClelland, Maier & Neustadt

[57] ABSTRACT

A vertical type heat-treatment apparatus of the invention has an adjusting mechanism capable of setting the flow rate of clean air flowing out from a first clean room to a second clean room to be a predetermined value. With this arrangement, the apparatus can be reduced in size and can prevent impurities from adhering to objects to be treated, thereby improving the productivity.

11 Claims, 3 Drawing Sheets

VERTICAL TYPE HEAT-TREATMENT APPARATUS

BACKGROUND OF THE INVENTION

1. Field of the Invention

The present invention relates to a vertical type heat-treatment apparatus.

2. Description of the Related Art

In a manufacturing process of semiconductor devices, a furnace is used to form an insulating film, a compound semiconductor thin film, an organic metal thin film, and the like on a semiconductor wafer as an object to be treated. Such a furnace is normally designed to treat 100 products or more at once so as to improve productivity. Furnaces can be classified into horizontal type furnaces which are horizontally installed and vertical type furnaces which are vertically installed. A great deal of attention has been paid to vertical type furnaces because installation space can be reduced.

A vertical furnace, for example, has the following arrangement. The vertical furnace has a loading mechanism for vertically moving a boat. A large number of wafers are mounted on the boat at predetermined intervals. A reaction furnace is arranged above the loading mechanism.

The vertical type furnace is normally arranged in a clean room. The clean room supplies clean air to the vertical type furnace so as to prevent impurities from adhering to wafers. An enormous cost is required to keep high cleanliness of a clean room. For this reason, a limited space in the clean room must be effectively used. From this point of view, the front surface portion of the vertical furnace is placed to oppose the inside of the clean room, and other portions are placed in a room which is adjacent to the clean room and has a low cleanliness.

Clean air, however, normally flows downward in the clean room to form a downflow. For this reason, the vertical type furnace becomes an obstacle to the flow of air, and it is difficult for clean air to reach the loading mechanism located below the furnace. Hence, a fan mechanism for clean air is independently arranged in the installation area (to be referred to as a loading area hereinafter) of the loading mechanism. By using this fan mechanism, clean air is blown into the clean room through the loading area. As a result, impurities such as dust in the loading area are blown into the clean room. Since the flow of clean air in the clean room is a downflow, the air containing the impurities blown from the fan mechanism and passing through the loading area collides with the floor of the clean room. As a result, the impurities blown from the loading area into the clean room are discharged toward the floor of the clean room.

The vertical type heat-treatment apparatus comprising the vertical type furnace having the above described arrangement, however, has the following problems:

(1) If a special clean air fan mechanism is arranged to remove impurities in the loading area, the overall apparatus becomes complicated and is increased in size.

(2) Turbulence may occur near the vertical type furnace depending on a flow rate of clean air sent from the special fan mechanism, and impurities reach components such as the vertical type furnace in the clean room, resulting in adverse effects.

In order to solve these problems, the following countermeasure has been taken.

A clean room is normally set to have an atmosphere having a positive pressure higher than that of a maintenance room which is adjacent to the clean room and is used to perform maintenance and the like. A flow path is formed in the clean room by utilizing the difference in pressure between these atmospheres so as to cause clean air flowing downward to pass the loading area and introduce it to the maintenance room.

In this case, however, air from the maintenance room may flow into the loading area to cause turbulence or the like depending on a difference in pressure between the clean and maintenance rooms or the size of a clean air flow path. For this reason, impurities which are present in the loading area cannot be reliably removed, and the vertical furnace and the like may be adversely affected.

SUMMARY OF THE INVENTION

It is an object of the present invention to provide a compact vertical type heat-treatment apparatus capable of preventing impurities from adhering to an object to be treated and improving productivity.

According to present invention, there is provided a vertical type heat-treatment apparatus comprising:

a first clean room having an atmosphere of a predetermined cleanliness;

a second clean room adjacent to the first clean room and having an atmosphere of a cleanliness lower than that of the atmosphere of the first clean room;

a heat-treatment section arranged on a second clean room side and having an inlet/outlet port for an object to be treated at a bottom portion thereof; and a loading area arranged immediately below the inlet/outlet port and including an adjusting mechanism having an opening communicating with the first clean room and a door for loading and unloading the object, the adjusting mechanism adjusting a flow rate of clean air flowing out from the first clean room to the second clean room.

DETAILED DESCRIPTION OF THE PREFERRED EMBODIMENT

An embodiment of the present invention will be described below with reference to the accompanying drawings.

Figure 1:
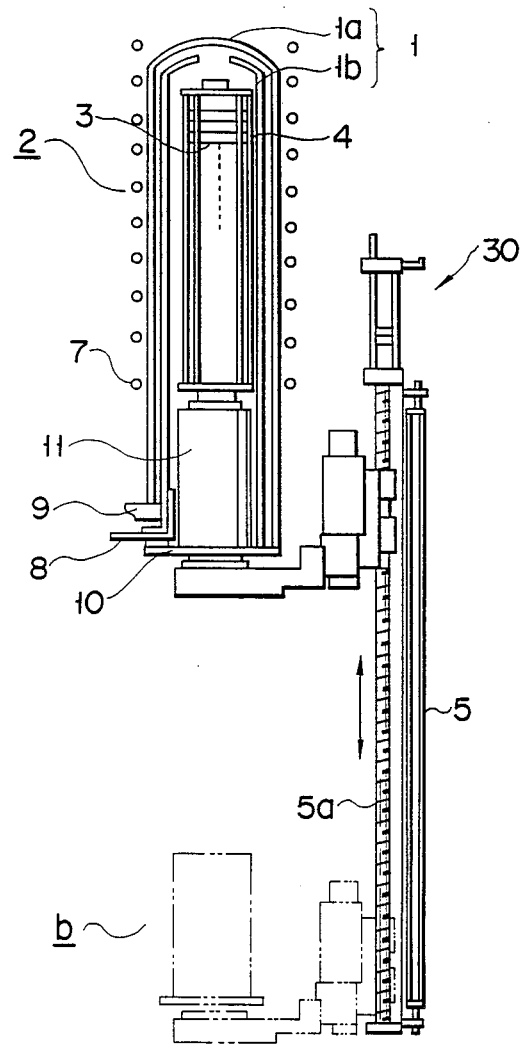
FIG. 1 is a view showing an arrangement of a vertical type heat-treatment apparatus according to an embodiment of the present invention.

FIG. 1 shows an arrangement of a vertical type heat-treatment apparatus according to the embodiment of the present invention. This apparatus constitutes a vertical type CVD apparatus for performing a batch process of semiconductor wafers. Referring to FIG. 1, reference numeral 1 denotes a double reaction tube constituting a vertical type furnace. The reaction tube 1 has its longitudinal direction aligned in the vertical direction. The reaction tube 1 comprises an outer tube 1a and an inner tube 1b arranged in a noncontact state with respect to the tube 1a. The reaction tube 1 consists of a material which does not easily react with a reaction gas and has high heat resistance, e.g., quartz. A heater 7 having, e.g., a coil-like shape, is wound around the outer surface of the reaction tube 1.

The heater 7 is connected to a heating mechanism (not shown) constituted by, e.g., an AC power source. By using the heater 7, semiconductor wafers 3 (to be described later) in the reaction tube 1 are uniformly heated to, e.g., 500° to 1,000° C.

The lower end portion of the reaction tube 1 can be freely opened/closed by a lid 10. In addition, an exhaust pipe 9 is connected to the lower end portion of the reaction tube 1. The exhaust pipe 9 is connected to a vacuum pump (not shown) capable of exhausting a reaction gas. The pressure in the reaction tube 1 can be set to a predetermined value in accordance with an exhaust amount from the exhaust pipe 9.

A gas feed pipe 8 is attached to the lid 10 so as to feed a predetermined reaction gas in the inner tube 1b. The gas feed pipe 8 is connected to a gas source through a microcontroller (not shown) or the like. The predetermined reaction gas is fed in the reaction tube 1 through the gas feed pipe 8. The fed reaction gas flows from the lower portion to the upper portion of the inner tube 1b, and turns downward at the upper portion to flow along a space between the inner and outer tubes 1b and 1a. The gas is then exhausted outside from the exhaust pipe 9. A predetermined heat treatment of the semiconductor wafers 3 is performed in such a continuous downflow of the reaction gas.

A heat-insulating cylinder 11 to be stored in the inner tube 1b is arranged on the lid 10. A boat 4 on which the semiconductors 3 are mounted is placed on the heat-insulating cylinder 11. 100 to 150 semiconductor wafers 3 are normally mounted on the boat 4 at predetermined intervals. The boat 4 is made of a material which does not easily react with a reaction gas and has high heat resistance, e.g., quartz.

A treatment section 2 is constituted by the reaction tube 1 having the above-described arrangement.

The lid 10 is attached to a convey mechanism 5 formed upright to be substantially parallel to the reaction tube 1. The lid 10 is vertically moved along a ball screw 5a constituting the convey mechanism 5 so as to load or unload the boat 4 in or from the reaction tube 1 through the loading area immediately below the reaction tube 1. The boat 4 is conveyed to the loading area 6 by a convey mechanism (not shown).

An operation of the vertical type heat-treatment apparatus having the above-described arrangement is performed by a control section (not shown).

Figure 2:
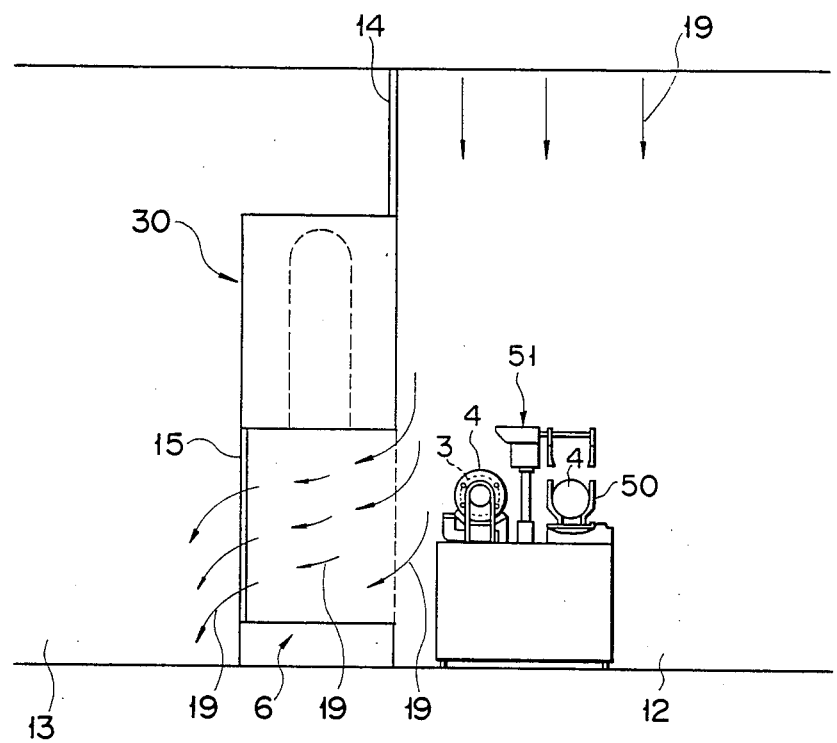
FIG. 2 is a view showing the overall vertical type heat-treatment apparatus of the present invention.

As shown in FIG. 2, the front surface portion of a vertical type heat-treatment apparatus main body 30 is placed in a first clean room 12 having high cleanliness while rear portions other than the front surface portion are placed in a second clean room 13 having low cleanliness. The cleanliness of the first clean room 12 is set to be, e.g., about class 10. The cleanliness of the second clean room 13 is set to be, e.g., class 100 or more. In this case, for example, class 10 indicates that the number of dust particles having a size of 0.5 μm which are present per cubic foot is not more than 10.

A partition wall 14 which is a hanging screen is formed at a boundary portion between the adjacent first and second clean rooms 12 and 13, i.e., at a flat portion including the front surface portion of the main body 30.

The ambient pressure of the first clean room 12 is set to be higher (positive) than that of the second clean room 13. By utilizing this differential pressure, a downflow of clean air 19 is formed from the first clean room 12 to a lower portion of the main body 30 installed in the second clean room 13. The air 19 then passes through the loading area 6 to be supplied to the maintenance room 13 side.

In the first clean room 12, there may be a wafer transfer device 51 for transferring wafers 3 between wafer boat 4 and wafer carrier 50.

An adjusting mechanism 15 for adjusting the flow rate of clean air passing through the loading area 6 is attached to the main body 30. The adjusting mechanism 15 has a structure shown in, e.g., FIG. 3.

Figure 3:
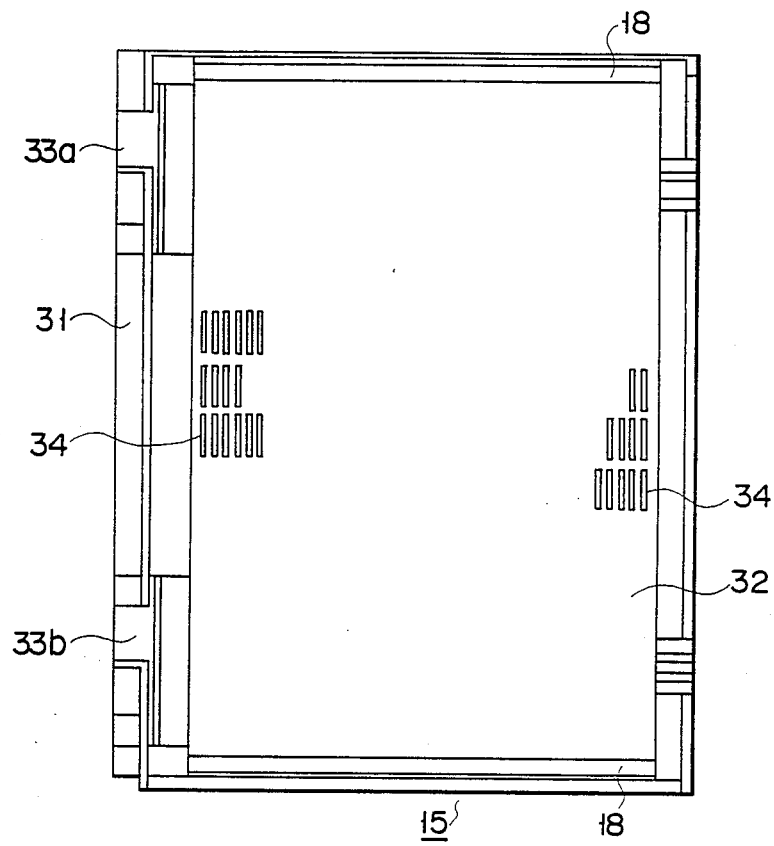
FIG. 3 is a view showing an adjusting mechanism of the vertical type heat-treatment apparatus in FIG. 1.

FIG. 3 shows the adjusting mechanism 15 viewed from the second clean room 13 side toward the first clean room 12. The adjusting mechanism 15 comprises a frame member 31 having an opening communicating with the loading area 6 of the main body 30. A door 32 for opening/closing the opening is mounted on the frame member 31 through hinges 33a and 33b. The door 32 is constituted by, e.g., a stainless steel member of 800×600 mm. Openings 34 serving as air flow ports are formed on both side portions of the door 32. The openings 34 are formed by forming a plurality of, e.g., 50×5-mm slits in both side portions of the door 32 at predetermined intervals in the longitudinal and lateral directions. The opening ratio of the openings 34 is set to be, e.g., 50% of the area of one surface of the door 32.

Figure 4:
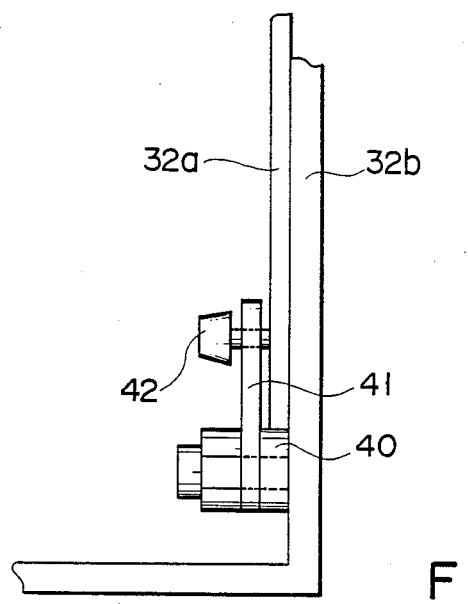
FIG. 4 is a view showing a main part of the adjusting mechanism in FIG. 1.

The door 32 has a double structure. More specifically, two door constituent plates 32a and 32b having the above-described openings 34 are slidably stacked on each other. One plate 32a is guided by guide bars 18 formed on the upper and lower end portions thereof so as to be moved in the lateral direction (widthwise direction) by about 15 mm with respect to the other plate 32b. When the openings 34 of two plates 32a and 32b coincide with each other, the opening ratio is set to be 50% of the area of one surface of the door 32. The opening ratio can be arbitrarily adjusted within the range of 0 to 50% by shifting one plate 32a with respect to the other plate 32b. One plate 32a is fixed, for example, as shown in FIG. 4, by urging a clamp bolt 42 against the plate 32a. The bolt 42 is formed on a lock metal member 41 fixed on a nut 40 supporting the lower end portion of the plate 32a. By changing the opening ratio in this manner, the flow rate of clean air flowing from the first clean room 12 to the second clean room 13 through the loading area 6 can be adjusted.

The vertical type heat-treatment apparatus having the above-described arrangement forms thin films on the semiconductor wafers 3 upon a predetermined heat treatment as follows.

The semiconductor wafers 3 are mounted on the boat 4 by a wafer transfer unit (not shown). The boat 4 is then conveyed to the loading area 6 by a boat convey unit (not shown). The conveyed boat 4 is placed on the heat-insulating cylinder 11.

Subsequently, the boat 4 is moved upward by a predetermined amount by the convey mechanism 5. With this operation, the boat 4 is placed at a predetermined position in the reaction tube 1 without being brought into contact with the inner wall of the reaction tube 1. If the lower end portion of the reaction tube 1 and the lid 10 are brought into contact with each other at this time, all the semiconductor wafer 3 can be automatically positioned to predetermined positions, and at the same time, the reaction tube 1 is air-tightly sealed.

The reaction tube 1 is then evacuated by a vacuum pump (not shown) through the exhaust pipe 9 to e.g., 0.1 to 2 Torr. Power is supplied to the heater 7 in advance to set the heating temperature of the heater 7 at, e.g., 500° to 1,000° C.

In this state, a reaction gas is supplied in the inner tube 1b while its flow rate is adjusted by a mass flow controller (not shown) or the like. As a reaction gas, a gas mixture of, e.g., $SiH_4$ and $O_2$ is used.

An $SiO_2$ film is formed on a surface of each semiconductor wafer 3 placed in the reaction tube 1b by a reaction based on the following formula:

$$SiH_4 + O_2 \rightarrow SiO_2 + 2H_2$$

Upon reaction, the gas is exhausted outside through the exhaust pipe 9. After the above-described CVD process, supply of the reaction gas is stopped. The gas in the reaction tube 1 is then replaced with an inert gas such as $N_2$. With this operation, the pressure in the reaction tube is returned to a normal pressure.

Subsequently, the boat 4 on which the unloaded semiconductor wafers 3 are mounted is unloaded from the reaction tube 1 to the loading area 6, thereby completing the heat treatment.

When the above-described heat treatment is to be performed, the flow rate of clean air passing through the loading area 6 is adjusted in advance. That is, the opening ratio of the door 32 of the adjusting mechanism 15 is set to a predetermined value. This value can be determined on the basis of the difference in pressure between the first and second clean rooms 12 and 13, the amount of clean air to be flowed downward in the first clean room 12, or the like.

In this manner, a predetermined amount of the clean air 19 flowing downward in the first clean room 12 is introduced into the second clean room 13 through the loading area 6, as shown in FIG. 2.

As a result, dust and the like in the loading area 6 can be removed therefrom and moved to the second clean room side by clean air from the first clean room 12. Therefore, adhesion of dust and the like to objects to be treated can be prevented without increasing the size of the apparatus, thus increasing the yield.

By further setting the flow rate of clean air from the first clean room 12 to a predetermined value within the range determined in the above-described manner, cooling of the heat-treated semiconductor wafers 3 is promoted to suppress thermal distortion, thereby improving the productivity.

The present invention is not limited to apparatuses for a CVD process, but can be applied to apparatuses for a heat treatment for diffusion/oxidation or annealing/ epitaxial growth, or apparatuses for sputtering/etching/ ion implantation.

In addition, the adjusting mechanism 15 comprises a door having a double structure in which the door 32 is constituted by the two door constituent plates. However, the present invention is not limited to this. Any structure can be used as the adjusting mechanism 12 as long as it can adjust the flow rate of clean air flowing from the first clean room 12.

Moreover, as objects to be treated, to which the present invention is applied, liquid crystal plates and the like can be used in addition to semiconductor wafers.

What is claimed is:

1. A vertical type heat-treatment apparatus comprising:
    a first clean room having an atmosphere of a predetermined cleanliness;
    a second clean room adjacent to said first clean room and having an atmosphere of a cleanliness less than that of the atmosphere of said first clean room;
    a heat-treatment section arranged on a second clean room side and having an inlet/outlet port for an object to be treated at a bottom portion thereof; and
    a loading area arranged immediately below said inlet/outlet port and including an adjusting mechanism having an opening communicating with said first clean room and a door for loading and unloading the object, said adjusting mechanism adjusting a flow rate of clean air flowing out from said first clean room to said second clean room,
    wherein said first clean room has a cleanliness of 0 to 1,000 particles/cubic feet, and said second clean room has a cleanliness of not less than 500 particles/cubic feet, said particles having a particle size of 0.5 $\mu$m.

2. An apparatus according to claim 1, wherein a pressure of the atmosphere of said first clean room is higher than that of said second clean room.

3. An apparatus according to claim 1, wherein said adjusting mechanism comprises an opening for adjusting a flow rate of clean air flowing out from said first clean room to the second clean room side, an opening ratio of said opening being variable.

4. An apparatus according to claim 1, wherein said adjusting mechanism comprises a door for loading or unloading the object.

5. An apparatus according to claim 3, wherein said opening for adjusting a flow rate of clean air consists of opening portions formed in door constituent plates of a double structure, which constitute said door for loading or unloading the object, the opening ratio being changed by shifting said door constituent plates from each other.

6. An apparatus according to claim 5, wherein the opening ratio is variable within a range of 0 to 50% with respect to an area of one surface of said door constituent plate.

7. An apparatus according to claim 5, wherein each of opening portions consists of one of slit-like, rectangular, polygonal, and substantially circular shapes.

8. An apparatus according to claim 1, wherein said heat-treatment section comprises a vertical type furnace.

9. An apparatus according to claim 8, wherein said vertical type furnace consists of one of a CVD furnace, an oxidation/diffusion furnace, an annealing furnace, an epitaxial growth furnace, a sputtering furnace, an etching furnace, and an ion-implantation furnace.

10. An apparatus according to claim 9, wherein the object to be treated consists of one of a semiconductor ware and a liquid crystal plate, a large number of objects to be treated being mounted on a boat and being loaded and unloaded in and from said process section through the loading area.

11. A vertical type heat-treatment apparatus comprising:
    a first clean room having an atmosphere of a predetermined cleanliness;

a second clean room adjacent to said first clean room and having an atmosphere of a cleanliness lower than that of the atmosphere of said first clean room;

a heat-treatment section arranged on a second clean room side and having an inlet/outlet port for an object to be treated at a bottom portion thereof; and a loading area arranged immediately below said inlet/outlet port and including an adjusting mechanism having an opening communicating with said first clean room and a door for loading and unloading the object, said adjusting mechanism adjusting a flow rate of clean air flowing out from said first clean room to said second clean room, wherein said adjusting mechanism comprises an opening for adjusting a flow rate of clean air flowing out from said first clean room to the second clean room side, an opening ratio of said opening being variable, and wherein said opening for adjusting a flow rate of clean air consists of opening portions formed in door constituent plates of a double structure, which constitute said door for loading or unloading the object, the opening ratio being changed by shifting said door constituent plates relative to each other.

* * * * *